United States Patent [19] — [11] 3,806,738
Chin et al. — [45] Apr. 23, 1974

[54] FIELD EFFECT TRANSISTOR PUSH-PULL DRIVER

[75] Inventors: William B. Chin, Wappingers Falls; Teh-Sen Jen, Fishkill, both of N.Y.

[73] Assignee: International Business Machines Corporation, Armonk, N.Y.

[22] Filed: Dec. 29, 1972

[21] Appl. No.: 319,822

[52] U.S. Cl. .................. 307/228, 307/251, 307/304
[51] Int. Cl. .............................................. H03k 4/08
[58] Field of Search ........ 307/205, 221 C, 228, 251, 307/279, 304

[56] References Cited

UNITED STATES PATENTS

| | | | |
|---|---|---|---|
| 3,699,539 | 10/1972 | Spence | 307/205 |
| 3,575,613 | 4/1971 | Ebertin | 307/251 |
| 3,714,466 | 1/1973 | Spence | 307/304 |
| 3,641,366 | 2/1972 | Fujimoto | 307/205 |
| 3,660,684 | 5/1972 | Padgett | 307/279 |
| 3,675,043 | 7/1972 | Bell | 307/251 |
| 3,619,670 | 11/1971 | Heimbigner | 307/304 |

*Primary Examiner*—Rudolph V. Rolinec
*Assistant Examiner*—Ro E. Hart
*Attorney, Agent, or Firm*—Sughrue, Rothwell, Mion, Zinn & Macpeak

[57] ABSTRACT

An integrated circuit FET push-pull driver includes a first FET boot-strap circuit for charging the driver output node to a value below the driver supply voltage. A second FET boot-strap circuit adds additional charge to the output node to drive the output node to the supply voltage. An FET clamping circuit functions to prevent the additional charge from leaking off through the first boot-strap circuit.

5 Claims, 1 Drawing Figure

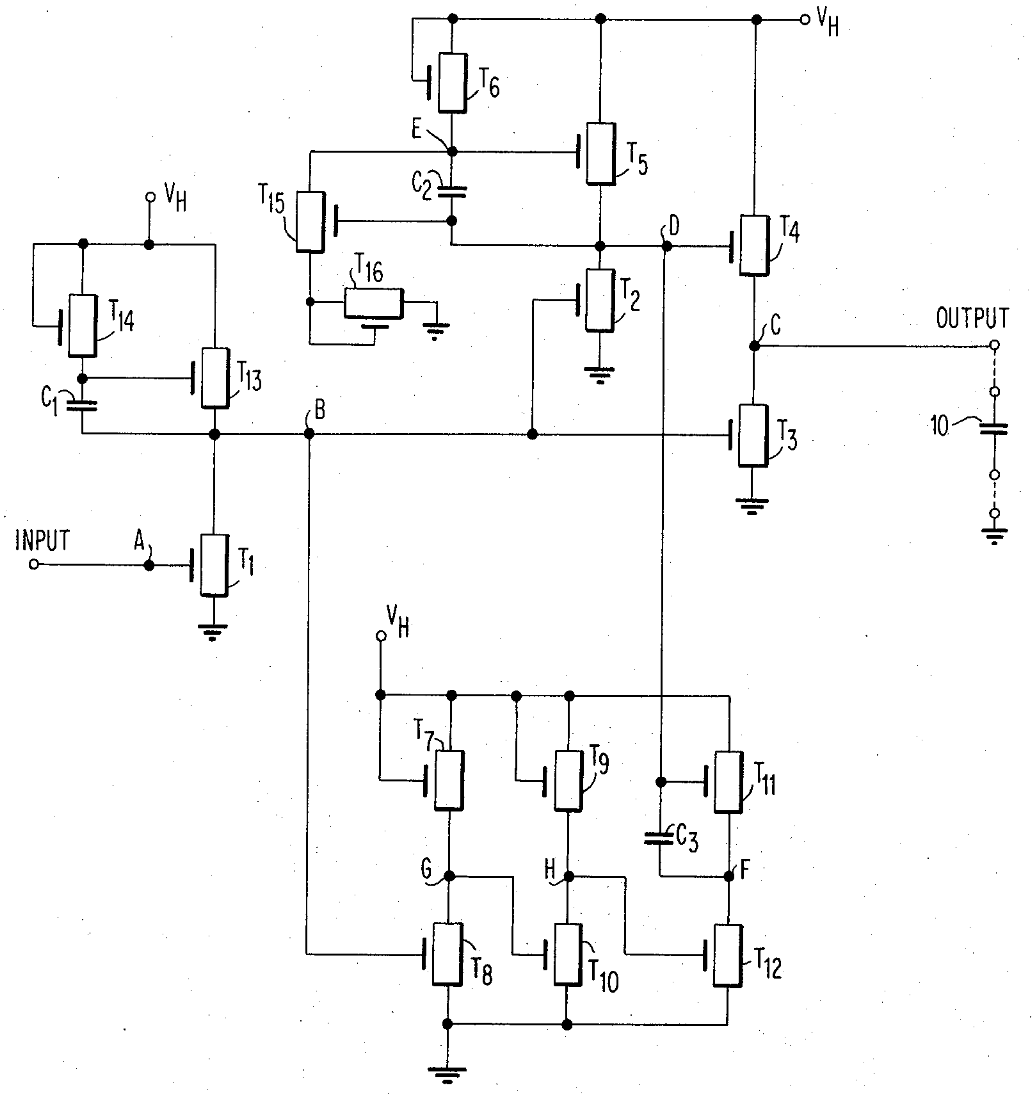
V_H
T6
E
T5
C2
T15
D
T4
V_H
T16
T14
T2
OUTPUT
C
T13
C1
B
10
T3
INPUT
A
T1
V_H
T7
T9
T11
C3
G
H
F
T8
T10
T12

FIELD EFFECT TRANSISTOR PUSH-PULL DRIVER

BACKGROUND OF THE INVENTION

1. Field of the Invention

The invention relates to the field of integrated circuits employing field effect transistors (FET) and, more particularly, to such circuits of the push-pull driver type.

2. Description of the Prior Art

Integrated circuit FET push-pull drivers are per se known in the prior art. Such drivers include two FETs connected in series between a supply voltage and ground, with the output node being at the junction of the FETs. Because of the inherent threshold voltage drop in an FET, boot-strap circuits including feedback capacitors are used to raise certain nodes of the circuit above the supply voltage. In practice, a node is first precharged by a precharging circuit to a voltage below the supply voltage, and then a boot-strap circuit adds additional charge to raise the node voltage above the supply voltage.

However, when this technique is applied to a push-pull driver circuit, the additional charge leaks off the gate node of the pull-up output FET, thereby causing the driver output node voltage to fall below the desired output level.

SUMMARY OF THE INVENTION

The object of the invention is to provide an improved low power, high performance FET push-pull driver especially suitable for driving a highly capacitive load.

The preferred embodiment of the invention may be summarized as including a precharging circuit for charging the output node of the drive to a voltage which is one FET threshold voltage below the driver supply voltage. A boot-strap circuit functions to add additional charge to the output node to drive the output node up to the supply voltage. A circuit responsive to the additional charge disables the precharging circuit to prevent the additional charge from leaking off therethrough.

BRIEF DESCRIPTION OF THE DRAWING

The single FIGURE is a circuit diagram of a preferred embodiment of the invention.

DESCRIPTION OF A PREFERRED EMBODIMENT

An integrated FET (field effect transistor) push-pull driver circuit embodying this invention is shown in the drawing. For the purpose of illustrating this invention, the supply voltage $V_H$ is a negative voltage typically in the range of −9 volts and the threshold voltage $V_T$ of each of the FETs is in the range of approximately 2 volts. It will also be assumed that the reference voltage is ground or 0 volts and that the input signal applied to input node A is either the supply voltage $V_H$ or the reference voltage (0 volts). Furthermore, each of the FETs is of the insulated gate type (IGFET) or metal oxide semiconductor (MOS) type.

In order for an FET to be conducting or on, the gate voltage must be more negative by at least one threshold $V_T$ than the source electrode. In the circuit illustrated in the drawing, the drain electrodes of the FETs are connected to the negative supply voltage $V_H$ and their source electrodes are connected to the ground or reference voltage.

In describing the operation of the circuit, it will be assumed that the input signal on the input node A has just gone from the negative supply voltage $V_H$ to the reference or ground voltage. Therefore, FET $T_1$ is turned off, and node B is then boot-strapped to the supply voltage $V_H$ through FET $T_{13}$ and the capacitor $C_1$, the capacitor having been previously charged to a voltage equal to the difference between the supply voltage $V_H$ and the threshold voltage $V_T$ through the normally conducting $T_{14}$ whose gate and drain electrodes are both connected to the supply voltage $V_H$. When $T_1$ turns off, the boot-strap function of $C_1$ actually charges the gate of $T_{13}$ to a voltage substantially above $V_H$ to assure that the node B is driven to the $V_H$ level.

Consequently, since node B is charged to $V_H$, FET $T_3$ turns on and thereby discharges the output node C to ground. At the same time, the voltage at node B turns on FET $T_2$ to discharge node D to ground, thereby assuring the turn off of the output pull-up FET $T_4$; that is, the output node is in its up or ground level state. Node F is also discharged to ground at this time by the turning on of FET $T_{12}$ which is turned on in the following manner. The voltage $V_H$ at node B turns on FET $T_8$ which discharges node G to ground, thereby turning off FET $T_{10}$. The turning off of $T_{10}$ permits node H to be charged from the supply voltage $V_H$ through FET $T_9$ to a voltage equal to the supply voltage $V_H$ minus one threshold voltage $V_T$. This voltage at node H is sufficient to turn on $T_{12}$ through which node F then discharges to ground.

When the input signal at node A changes from ground to $V_H$, $T_1$ is turned on and discharges the node B to ground. Therefore, the gate electrode of the output pull-down FET $T_3$ is grounded, and $T_3$ turns off. At the same time, the gate electrode of $T_2$ is grounded, thereby also turning off $T_2$, which action causes node E to be boot-strapped via the feedback capacitor $C_2$ to a voltage above $V_H$, thereby turning on FET $T_5$ very hard to charge node D to $V_H$ which causes the output pull-up FET $T_4$ to turn on. Consequently, the output node C is charged to one threshold drop below the supply voltage, i.e. $V_H - V_T$. Because of circuit delays, $T_4$ is actually turned on slightly after $T_3$ is turned off. Furthermore, before the input signal had switched to $V_H$, the capacitor $C_2$ had been charged through normally conducting FET $T_6$ to $V_H - V_T$.

The FETs $T_5$ and $T_6$ and capacitor $C_2$ may be characterized as a boot-strap circuit for precharging node D to the $V_H$ level, and thereby output node C to the $V_H - V_T$ level.

When node B is discharged to ground, $T_8$ is turned off to allow node G to charge through the normally conducting FET $T_7$ to $V_H - V_T$, thereby turning on $T_{10}$ which in turn discharges node H to ground and turns $T_{12}$ off. The delays in switching of the FETs $T_7$, $T_8$, $T_9$ and $T_{10}$ permit $T_{12}$ to be turned off slightly later than $T_2$, that is, after node D has already been precharged to $V_H$.

When $T_{12}$ turns off, $T_{11}$ turns on and node F is boot-strapped up to $V_H$, with the resultant pulse being coupled through feedback capacitor $C_3$ to charge the node D to a voltage substantially (typically 70 to 80 percent) higher than $V_H$. In other words, the charge on the capacitor $C_3$ is added to the precharge already on node D, thereby raising the voltage at node D to a value substantially above supply voltage $V_H$. Consequently, the pull-up driver FET $T_4$ will be turned on harder and drive the output node C to $V_H$. The FETs $T_{11}$ and $T_{12}$ and the capacitor $C_3$ may be characterized as a bootstrap circuit for charging the precharged node D to a voltage substantially above $V_H$.

However, at this point in time, since the node D is at a voltage substantially more negative than the supply voltage $V_H$, the charges coupled into node D from capacitor $C_3$ will leak away to the lower supply voltage $V_H$ through FET $T_5$ unless $T_5$ is turned off. In order to prevent this charge leakage, FET $T_{15}$ and FET $T_{16}$, forming a clamping circuit, are connected between node E and ground to quickly discharge node E below $V_H$. Since node D is at a voltage above $V_H$, FETs $T_{15}$ and $T_{16}$ are turned on hard to discharge node E quickly, thereby quickly turning off $T_5$, trapping the charge on node D, and preventing node D from discharging through $T_5$ to the supply voltage $V_H$. As a result, node D is maintained at a voltage well above the supply voltage $V_H$, thereby assuring that the pull-up FET $T_4$ is kept turned on hard so that the voltage at output node D is maintained at the desired supply voltage level $V_H$ for an extended period of time.

The circuit described above and illustrated in the drawing provides a novel low-power, high performance FET push-pull driver circuit which is particularly useful in driving highly capacitive loads such as indicated by the capacitor 10 shown in the drawing.

While the invention has been particularly shown and described with reference to a preferred embodiment thereof, it will be understood by those skilled in the art that various changes in form and details may be made therein without departing from the spirit and scope of the invention.

We claim:

1. In an FET push-pull driver circuit including an input node, first and second output FETs connected between a supply voltage and a reference voltage, and an output node connected between said first and second FETs, an improved charging circuit for charging the gate node of said first output FET to a voltage above the supply voltage to charge the output node to the supply voltage and for preventing leaking of the charge from said gate node, comprising:

a. a first boot-strap circuit coupled between said input node and said gate node of said first FET including a precharging FET which is turned on by said input signal to precharge said gate node of said first FET to said supply voltage, thereby turning on said first FET and charging said output node to a voltage below said supply voltage;

b. a second boot-strap circuit coupled between said input node and said gate node for supplying additional charge to said gate node of said first FET to drive the voltage of said gate node to a value above said supply voltage, thereby turning on said first FET harder to charge said output node to said supply voltage; and c. clamping circuit means responsive to the increased value of voltage at said gate node for turning off said precharging FET and preventing said gate node from discharging through said first bootstrap circuit, thereby maintaining said output node at said supply voltage.

2. An improved charging circuit as defined in claim 1 wherein said clamping circuit comprises normally off FET means connected between said reference voltage and the gate node of said precharging FET and having a gate electrode connected to said gate node of said first FET, whereby said FET means is turned on by the increased value of voltage to connect to ground the gate node of said precharging FET and thereby turn off said precharging FET.

3. An improved charging circuit as defined in claim 1 further comprising a capacitive load connected to said output node.

4. An improved charging circuit as defined in claim 1 further comprising a third boot-strap circuit coupled between said input node and the gate node of said second FET for turning on said second FET in the absence of an input signal and thereby discharging said output node to said reference voltage.

5. A push-pull driver circuit comprising:

a. an input node;

b. an input FET having its gate connected to said input node and its source connected to a reference voltage;

c. first and second output FETs connected in series between a supply voltage and the reference voltage, the drain of said input FET being connected to the gate node of said second output FET;

d. an output node connected between said first and second output FETs;

e. a first boot-strap circuit connected to the gate node of said first output FET for precharging said gate node to said supply voltage in response to the application of an input signal to said input node thereby turning on said first output FET and charging said output node to a voltage below said supply voltage;

f. discharge means connected to said gate node of said first output FET for discharging said gate node to said reference voltage in the absence of a signal at said input node;

g. a second boot-strap circuit connected to said gate node of said first output FET to drive the voltage of said gate node to a value above said supply voltage, thereby turning on said first output FET harder to charge said output node to said supply voltage;

h. circuit means responsive to the increased value of voltage at said gate node of said first output FET for preventing said gate node from discharging through said first boot-strap circuit, thereby maintaining said output node at said supply voltage.

* * * * *